(12) United States Patent
Hughes et al.

(10) Patent No.: US 10,972,123 B1
(45) Date of Patent: Apr. 6, 2021

(54) SIGNAL PROCESSING STRUCTURE

(71) Applicant: Dialog Semiconductor B.V., s-Hertogenbosch (NL)

(72) Inventors: Ashley Hughes, Edinburgh (GB); Wessel Harm Lubberhuizen, Delden (NL)

(73) Assignee: Dialog Semiconductor B.V., 's-Hertogenbosch (NL)

(*) Notice: Subject to any disclaimer, the term of this patent is extended or adjusted under 35 U.S.C. 154(b) by 0 days.

(21) Appl. No.: 16/407,250

(22) Filed: May 9, 2019

(51) Int. Cl.
*H03M 3/00* (2006.01)
*H04R 1/10* (2006.01)
*H04B 7/015* (2006.01)

(52) U.S. Cl.
CPC .......... *H03M 3/474* (2013.01); *H03M 3/368* (2013.01); *H03M 3/51* (2013.01); *H04B 7/015* (2013.01); *H04R 1/1083* (2013.01)

(58) Field of Classification Search
CPC ........ H03M 3/474; H03M 3/51; H03M 3/368; H04R 1/1083; H04B 7/015
USPC .................................................. 341/155, 143
See application file for complete search history.

(56) References Cited

U.S. PATENT DOCUMENTS

| | | |
|---|---|---|
| 3,793,513 A | 2/1974 | Kaneko |
| 5,262,972 A | 11/1993 | Holden et al. |
| 5,301,134 A | 4/1994 | Maruyama |
| 5,305,307 A | 4/1994 | Chu |
| 5,757,299 A | 5/1998 | Noro |
| 5,757,862 A | 5/1998 | Ishizu |
| 5,946,650 A | 8/1999 | Wei |
| 7,058,190 B1 | 6/2006 | Zakarauskas |
| 7,636,747 B2 | 12/2009 | Watanabe |

(Continued)

FOREIGN PATENT DOCUMENTS

| | | |
|---|---|---|
| EP | 2 860 874 | 12/2016 |
| GB | 2541977 | 3/2017 |
| WO | WO 2017/190976 | 11/2017 |

OTHER PUBLICATIONS

D.A. Johns et al., "Sigma-delta based IIR filters," [1991] Proceedings of the 34th Midwest Symposium on Circuits and Systems, Monterey, CA, USA, May 1992, pp. 210-213, vol. 1.

(Continued)

*Primary Examiner* — Jean B Jeanglaude
(74) *Attorney, Agent, or Firm* — Saile Ackerman LLC; Stephen B. Ackerman

(57) ABSTRACT

A signal processing structure and method are presented. A first digital filter operates on received sigma-delta modulated (SDM) input signals. A second pre-processing digital filter receives a SDM input signal, directly low pass filter the SDM input signal and provides an output SDM signal. The output sigma-delta modulated signal is provided as an input for said first digital filter. In standard digital systems operating with digital microphones, filtering of the microphones' output signal requires to first convert the signal into pulse code modulation (PCM), then filter and finally convert back to pulse density modulation (PDM). This approach increases the latency of the system because decimation and interpolation must be performed in order to pass from PDM to PCM. By using filters that operate directly on the oversampled PDM output of the digital microphones it is possible to reduce the latency of the system and minimize the hardware area.

13 Claims, 11 Drawing Sheets

(56) References Cited

U.S. PATENT DOCUMENTS

| | | | |
|---|---|---|---|
| 7,652,604 | B2 | 1/2010 | Parayandeh et al. |
| 7,696,913 | B2* | 4/2010 | Melanson ............ H02M 1/4225 341/143 |
| 7,756,222 | B2 | 7/2010 | Chen |
| 8,467,483 | B2* | 6/2013 | Vishakhadatta ..... H04B 1/0003 375/216 |
| 8,644,523 | B2* | 2/2014 | Clemow .............. G10K 11/178 381/71.6 |
| 8,737,636 | B2 | 5/2014 | Park et al. |
| 8,896,738 | B2 | 11/2014 | Sato et al. |
| 9,053,697 | B2 | 6/2015 | Park et al. |
| 9,065,471 | B1 | 6/2015 | Okuda |
| 9,209,828 | B2 | 12/2015 | Schubert et al. |
| 9,361,872 | B2 | 6/2016 | Park et al. |
| 9,584,146 | B2 | 2/2017 | Op 't Eynde et al. |
| 9,644,561 | B2 | 5/2017 | Magner |
| 9,659,558 | B2 | 5/2017 | Park et al. |
| 9,857,921 | B2 | 1/2018 | Pant |
| 10,236,905 | B1 | 3/2019 | Callanan et al. |
| 2005/0008071 | A1 | 1/2005 | Bose et al. |
| 2005/0053227 | A1 | 3/2005 | Fortier |
| 2007/0188218 | A1 | 8/2007 | Ueda |
| 2007/0273446 | A1 | 11/2007 | Kim |
| 2007/0285160 | A1 | 12/2007 | Kim |
| 2008/0225168 | A1 | 9/2008 | Ouslis |
| 2010/0318205 | A1* | 12/2010 | Ohkuri ................... H04R 3/002 700/94 |
| 2011/0007907 | A1 | 1/2011 | Park et al. |
| 2012/0148074 | A1 | 6/2012 | Bastiaens |
| 2014/0112492 | A1* | 4/2014 | Clemow .............. G10K 11/178 381/71.6 |
| 2014/0125504 | A1 | 5/2014 | Braswell |
| 2014/0333462 | A1 | 11/2014 | Breems |
| 2016/0173112 | A1* | 6/2016 | Das ......................... H03M 1/70 341/154 |

OTHER PUBLICATIONS

D. A. Johns et al., "Design and analysis of delta-sigma based IIR filters," IEEE Transactions on Circuits and Systems II: Analog and Digital Signal, Processing, vol. 40, Issue: 4, Apr. 1993, pp. 233-240.

D. A. Johns et al., "IIR filtering on sigma-delta modulated signals," Electronics Letters, Feb. 14, 1991, vol. 27, No. 4, pp. 307-308.

D. A. Johns, "Analog and Digital State-Space Adaptive IIR Filters", PhD Thesis, Mar. 1989, 153 pages.

D. A. Johns et al., "Adaptive Recursive State-Space Filters Using a Gradient-Based Algorithm," IEEE Transactions on Circuits and Systems, vol. 37, Issue: 6, Jun. 1990, pp. 673-684.

P. W. Wong et al., "FIR Filters with Sigma-Delta Modulation Encoding," IEEE Transactions on Acoustics, Speech, and Signal Processing, vol. 38, Issue: 6, Jun. 1990, pp. 979-990.

Horst Gether et al., A perspective on digital ANC solutions in a low latency dominated world, EDN, Jun. 19, 2017, https://www.edn.com/design/analog/4458544/A-perspective-on-digital-ANC-solutions-in-a-low-latency-dominated-world.

M. A. Aldajani et al., "Stability analysis of an adaptive structure for sigma delta modulation," ICECS 2000. 7th IEEE International Conference on Electronics, Circuits and Systems (Cat. No. 00EX445), Dec. 2000, pp. 129-132, vol. 1.

M. A. Aldajani et al., "Stability and Performance Analysis of an Adaptive Sigma-Delta Modulator," IEEE Transactions on Circuits and Systems II: Analog and Digital Signal Processing, vol. 48, No. 3, Mar. 2001, pp. 233-244.

Robert Bristow-Johnson, DSP Trick: Fixed-Point DC Blocking Filter With Noise-Shaping, dspGuru by Iowegian International, Apr. 17, 2011, https://dspguru.com/dsp/tricks/fixed-point-dc-blocking-filter-with-noise-shaping/, accessed on Apr. 18, 2019, 2 pages.

Richard G. Lyons, DSP Tricks: DC Removal, Embedded, Aug. 11, 2008, https://www.embedded.com/design/configurable-systems/4007653/DSP-Tricks-DC-Removal, accessed on Apr. 18, 2019, pp. 1-5.

Richard G. Lyons, Understanding digital signal processing, Second Edition, Prentice Hall PTR, 2004, chapter 13, pp. 84-87.

Ali Grami, Introduction to Digital Communications, Elsevier, 2016, chapter 5, pp. 217-264.

A query on the non-uniform Quantization, Stack Exchange, 2017, https://dsp.stackexchange.com/questions/40137/a-query-on-the-non-uniform-quantization, accessed on Apr. 18, 2019.

Jon Dattorro, The Implementation of Recursive Digital Filters for High-Fidelity Audio, Journal of Audio Engineering Society, Nov. 1988, vol. 36, No. 11, pp. 851-878 and Letters to the Editor.

Thomas Kite, Understanding PDM Digital Audio, Audio Precision Inc., 2012, http://users.ece.utexas.edu/~bevans/courses/rtdsp/lectures/10 Data Conversion/AP Understanding PDM Digital Audio.pdr, accessed on Apr. 18, 2019, pp. 1-9.

Xilinx, CIC, Aug. 2007, https://www.mit.bme.hu/systems/files/oktatas/targyak/8498/CIC_ppt.pdf, accessed in Apr. 18, 2019, 45 pages.

Alan V. Oppenheim et al., "Discrete-Time Signal Processing", 2010 Pearson, p. 412.

Notice of Allowance, U.S. Appl. No. 16/407,227, dated Apr. 20, 2020, First Named Inventor: Ashley Hughes, 10 pages.

U.S. Notice of Allowance, U.S. Appl. No. 16/407,227, filed May 9, 2019, Applicant: Hughes et al., dated Jan. 21, 2020, 13 pages.

U.S. Notice of Allowance, U.S. Appl. No. 16/407,242, filed May 9, 2019, Applicant: Hughes et al., dated Jan. 8, 2020, 12 pages.

U.S. Notice of Allowance; U.S. Appl. No. 16/407,247, filed May 9, 2019, Applicant: Hughes et al., dated Jan. 17, 2020, 12 pages.

U.S. Office Action, U.S. Appl. No. 16/407,232, Applicant: Hughes et al., dated Jun. 9, 2020, 25 pages U.S. Notice of Allowance, U.S. Appl. No. 16/407,227, First Named Inventor: Ashley Hughes, dated Jun. 5, 2020, 11 pages.

U.S. Notice of Allowance, U.S. Appl. No. 16/407,247, First Named Inventor: Ashley Hughes, dated Jun. 5, 2020, 9 pages.

U.S. Notice of Allowance, U.S. Appl. No. 16/407,242, First Named Inventor: Ashley Hughes, dated Jun. 2, 2020, 7 pages.

U.S. NOA, U.S. Appl. No. 16/854,341, First Named Inventor: Ashley Hughes, dated Nov. 9, 2020, 19 pages.

* cited by examiner

| Input | Delayed Input | Sum | Output (Sum >> 1) |
|---|---|---|---|
| 1 | 1 | 2 | 1 |
| 1 | -1 | 0 | 0 |
| -1 | 1 | 0 | 0 |
| -1 | -1 | -2 | -1 |

FIG. 4

| Input | Delayed Input 1 | Delayed Input 2 | Sum | Output (Sum / 3) |
|---|---|---|---|---|
| 1 | 1 | 1 | 3 | 1 |
| 1 | 1 | -1 | 1 | 1/3 |
| 1 | -1 | 1 | 1 | 1/3 |
| 1 | -1 | -1 | -1 | -1/3 |
| -1 | 1 | 1 | 1 | 1/3 |
| -1 | 1 | -1 | -1 | -1/3 |
| -1 | -1 | 1 | -1 | -1/3 |
| -1 | -1 | -1 | -3 | -1 |

| Input | Delayed Input (reset state) | Sum | Output (Sum >> 1) |
|---|---|---|---|
| 1 | 0 | 1 | 0 |
| -1 | 0 | -1 | -1 |

FIG. 9B

| Input | Delayed Input (reset state) | Sum | Output (Sum >> 1) |
|---|---|---|---|
| 1 | 1 | 2 | 1 |
| -1 | 1 | 0 | 0 |

FIG. 9C

| Input | Delayed Input (reset state) | Sum | Output (Sum >> 1) |
|---|---|---|---|
| 1 | -1 | 0 | 0 |
| -1 | -1 | 2 | -1 |

SIGNAL PROCESSING STRUCTURE

RELATED PATENT APPLICATIONS

This application is related to application Ser. No. 16/407,247, filed on May 9, 2019, application Ser. No. 16/407,242, filed on May 9, 2019, application Ser. No. 16/407,254, filed on May 9, 2019, application Ser. No. 16/407,232, filed on May 9, 2019 and application Ser. No. 16/407,227, filed on May 9, 2019, all of which are assigned to a common assignee, and all of which are incorporated by reference in their entirety.

TECHNICAL FIELD

The present disclosure relates to a signal processing structure, and in particular to electronic circuits for digital signal processing.

BACKGROUND

Processing of a digital signal is typically performed on Pulse-Code-Modulated (PCM) format digital data, however it is possible to produce circuits which perform operations such as filtering directly on Pulse-Density Modulated (PDM) signals, for example signals from digital microphones.

SUMMARY

In these applications, Signal to Noise Ratio (SNR) of the digitally processed output is often dependent on the oversampling ratio of the PDM signal being input to the system. The level of PDM noise is also an important consideration for a system which performs digital filtering and finally outputs an analogue signal, as a digital to analogue converter may have better output characteristics with lower high-frequency noise.

According to a first aspect of the disclosure there is provided a signal processing structure comprising: a first digital filter configured to operate on received sigma-delta modulated input signals; and a second pre-processing digital filter configured to receive a sigma-delta modulated input signal, directly low pass filter the sigma-delta modulated input signal and provide an output sigma-delta modulated signal; wherein said output sigma-delta modulated signal is provided as an input for said first digital filter.

Optionally, the second pre-processing digital filter comprises a moving average filter for said low pass filtering of the sigma-delta modulated input signal.

Optionally, the pre-processing digital filter comprises an upsampler configured such that a sampling rate of the output sigma-delta modulated signal is greater than a sampling rate of the input sigma-delta modulated signal.

Optionally, the upsampler comprises a zero order hold upsampler.

Optionally, the upsampler is placed before the moving average filter.

Optionally, the moving average filter comprises a series of N unit delay elements, an adder and a divide by M amplifier, wherein: N is an integer and M is equal to N+1; the series of unit delay element is configured to receive in input the SDM input signal and each unit delay element is configured to provide an output to the adder; the adder is configured to provide a sum of the SDM input signal and the output of each unit delay element in the plurality of unit delay elements; the divide by M amplifier is configured to divide the sum provided by the adder and to provide the output SDM signal.

Optionally, the output signal of the second pre-processing digital filter is configured to force the output sigma-delta modulated signal to a set value until the or each delay unit of the moving average filter has been filled with a valid state.

Optionally, the first digital filter comprises a sigma-delta modulator.

Optionally, the first digital filter comprises a quasi-orthornormal or a biquad filter.

According to a second aspect of the disclosure there is provided an audio signal processing structure, comprising: a first digital filter configured to operate on received sigma-delta modulated input audio signals; and a second pre-processing digital filter configured to receive a sigma-delta modulated input audio signal, directly low pass filter the sigma-delta modulated input audio signal and provide an output sigma-delta modulated audio signal; wherein said output sigma-delta modulated audio signal is provided as an input for said first digital filter.

According to a third aspect of the disclosure there is provided headphones comprising an audio signal processing structure, wherein the audio signal processing structure comprises: a first digital filter configured to operate on received sigma-delta modulated input audio signals; and a second pre-processing digital filter configured to receive a sigma-delta modulated input audio signal, directly low pass filter the sigma-delta modulated input audio signal and provide an output sigma-delta modulated audio signal; wherein said output sigma-delta modulated audio signal is provided as an input for said first digital filter.

Optionally, the audio signal processing structure is provided as part of an adaptive noise cancellation device.

According to a fourth aspect of the disclosure there is provided a method of signal processing comprising: providing a first digital filter configured to operate on received sigma-delta modulated input signals; and providing a second pre-processing digital filter configured to receive a sigma-delta modulated input signal, directly low pass filter the sigma-delta modulated input signal and provide an output sigma-delta modulated signal; wherein said output sigma-delta modulated signal is provided as an input for said first digital filter.

The method of the fourth aspect may also incorporate using or providing features of the first aspect and various other steps as disclosed herein.

BRIEF DESCRIPTION OF THE DRAWINGS

The disclosure is described in further detail below by way of example and with reference to the accompanying drawings, in which:

FIG. 4 is a table that illustrates the workings of the moving average filter as implemented in the embodiment of FIG. 3 for an example 2-level SDM input signal;

FIG. 7 is a table shows the operation of the moving average filter as implemented in the structure of FIG. 6;

FIGS. 9A, 9B and 9C are tables showing the operation of the moving average filter of FIG. 3 for a 2-level SDM input signal wherein a reset value has been forced in the unit delay element;

DESCRIPTION

The present disclosure provides a signal processing apparatus that has a processing block taking a sigma-delta modulated (SDM) signal as input and producing an SDM signal as output. The block provides some signal conditioning such that subsequent processing blocks may have an improved SNR on their output. Note here that the abbreviation "SDM" can mean sigma-delta modulation, sigma-delta modulated or a sigma-delta modulator as appropriate for the relative context.

Figure 1:
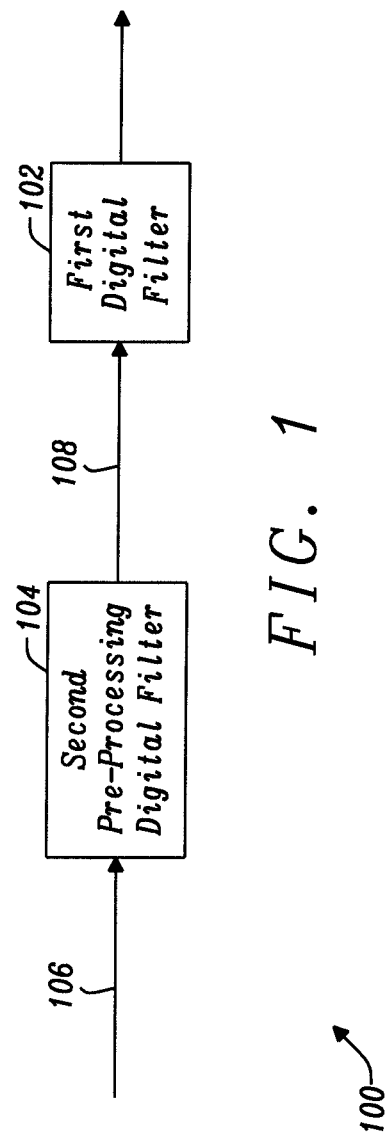
FIG. 1 is a schematic diagram of a signal processing structure 100 according to the present disclosure.

FIG. 1 is a schematic diagram of a signal processing structure 100 according to the present disclosure. The structure 100 comprises a first digital filter 102 and a second pre-processing digital filter 104. The pre-processing digital filter 104 is configured to receive a sigma-delta modulated input signal 106, directly low pass filter the sigma-delta modulated (SDM) input signal 106 and provide an SDM output signal 108. The digital filter 102 is configured to operate on the SDM signal output by the pre-processing digital filter 104.

In some embodiments, the pre-processing digital filter 104 comprises a moving average filter which is configured to low pass filter a pulse density modulated (PDM) input signal 106 and provide the SDM output signal 108.

In some embodiments, the pre-processing digital filter 104 further comprises an upsampler configured such that the sampling rate of the SDM output signal 108 is greater than the sampling rate of the input SDM signal 106. This is particularly useful when the SDM output signal 108 is to be further processed by filters that contain a sigma-delta modulator, since the signal-to-noise ratio of SDM-based filter designs is dependent on the oversampling ratio of signal being processed.

In some embodiments, the pre-processing digital filter 104 comprises both a moving average filter and an upsampler. The upsampler may be placed either before or after the moving average filter. If the upsampler is placed before the moving average filter, the moving average filter will operate at the upsampled rate.

Figure 2:
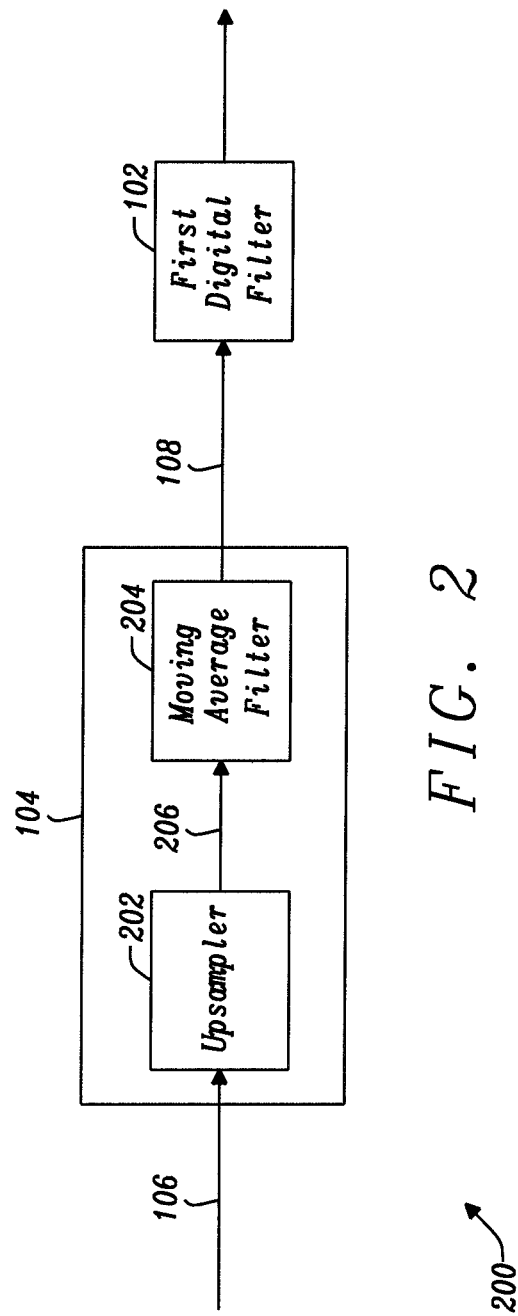
FIG. 2 is a schematic of an embodiment of the signal processing structure as shown in FIG. 1.

FIG. 2 is a schematic of an embodiment of the signal processing structure as shown in FIG. 1 and in accordance with a first embodiment of the present disclosure. Common features between Figures share common reference numerals and variables. In this embodiment, the pre-processing digital filter 104 comprises an upsampler 202 and a moving average filter 204.

The upsampler 202 has an input for receiving an SDM input signal 106 and an output for providing an SDM output signal 206 that has a sampling rate greater than the sampling rate of the SDM input signal 106. The moving average filter 204 has an input for receiving the SDM signal 206 output by the upsampler and an output for providing the SDM output signal 108 of the pre-processing filter 104.

The upsampler 202 could be implemented for example as a zero-order hold upsampler. If the incoming SDM signal at lower sampling rate is already stored in a register, zero-order hold functionality could be achieved for minimal extra gate cost by using directly the signal at lower sampling rate stored in that register.

In some embodiments, the moving average filter comprises a plurality of N unit delay elements, wherein N is an integer, an adder and a divide by M amplifier, wherein M is N+1. The adder has a plurality of M inputs for receiving and sum the SDM signal input into the moving average filter and the outputs of each unit delay element. Hereinafter M may be referred to as the length of the moving average filter.

Figure 3:
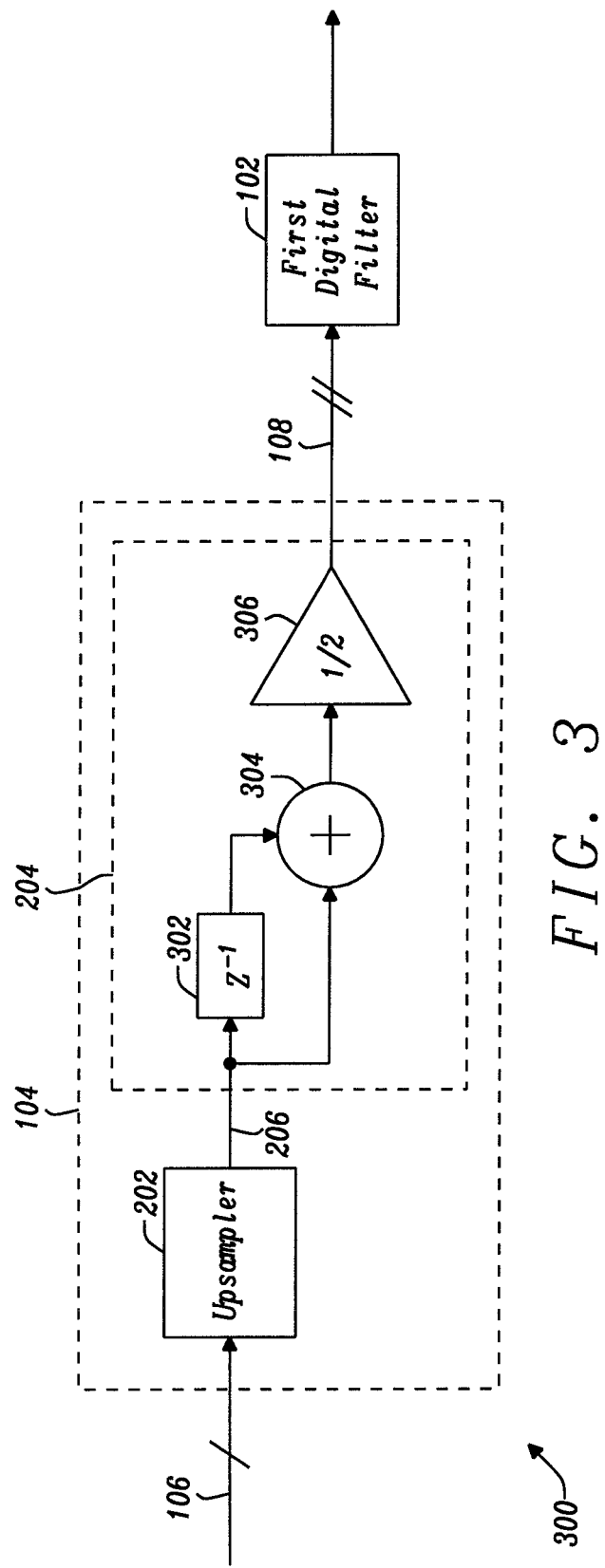
FIG. 3 is a schematic of an embodiment of the signal processing structure as shown in FIG. 2 and in accordance with a second embodiment of the present disclosure.

FIG. 3 is a schematic of an embodiment of the signal processing structure as shown in FIG. 2 and in accordance with a second embodiment of the present disclosure. Common features between Figures share common reference numerals and variables. In this embodiment, the moving average filter 204 is a length 2 moving average filter. The moving average filter 204 comprises a unit delay element 302, an adder 304 and a divide by two amplifier 306. The unit delay element has an input coupled to the SDM output signal 206 of the upsampler 202 and an output coupled to the adder 304. The adder 304 has a first input coupled to the output of the unit delay element 302, a second input coupled to the SDM signal 206 and an output coupled to the divide by two amplifier 306. The amplifier has an input coupled to the output of the adder 304 and an output for providing the SDM output signal 108.

It will be appreciated that if the signal processing structure of FIG. 3 is implemented without the upsampler 202, the input of the unit delay element 302 and the second input of the adder 304 would be coupled to the input SDM signal 106.

The table 400 shown in FIG. 4 illustrates the workings of the moving average filter 204 as implemented in the embodiment of FIG. 3 for an example 2-level SDM input signal 106. In this specific example, the two levels of the SDM input signal 106 are represented by −1 and 1, but it will be appreciated that any 1-bit representation could be used instead.

The data in the columns 402 and 404 illustrate all the possible input combinations for the adder 304 and the data in the columns 406 and 408 are the corresponding outputs of the adder 304 and of the divide by two multiplier 306. The column 404 corresponds to the first input of the adder 304, which is coupled to the output of the unit delay element 302. The column 402 corresponds to the second input of the adder 304, which is coupled to the input SDM signal 206. The column 406 corresponds to the output of adder 304. The column 408 corresponds to the output of the divide by two multiplier which is also the SDM output of the pre-processing filter 104.

The moving average filter 204 provides a sigma-delta modulated output signal without employing a sigma-delta modulator, wherein the SDM output signal has an extra level compared to the SDM input signal. For example, in the case illustrated in the table 400, the 2-level, 1 bit SDM input signal is converted into a 3-level, 2-bit SDM output signal.

In the specific embodiment of FIG. 3, since the moving average filter 204 is a length 2 moving average filter, the divide by two amplifier can be implemented using a 1-bit shift operation, for improved efficiency.

Figure 5:
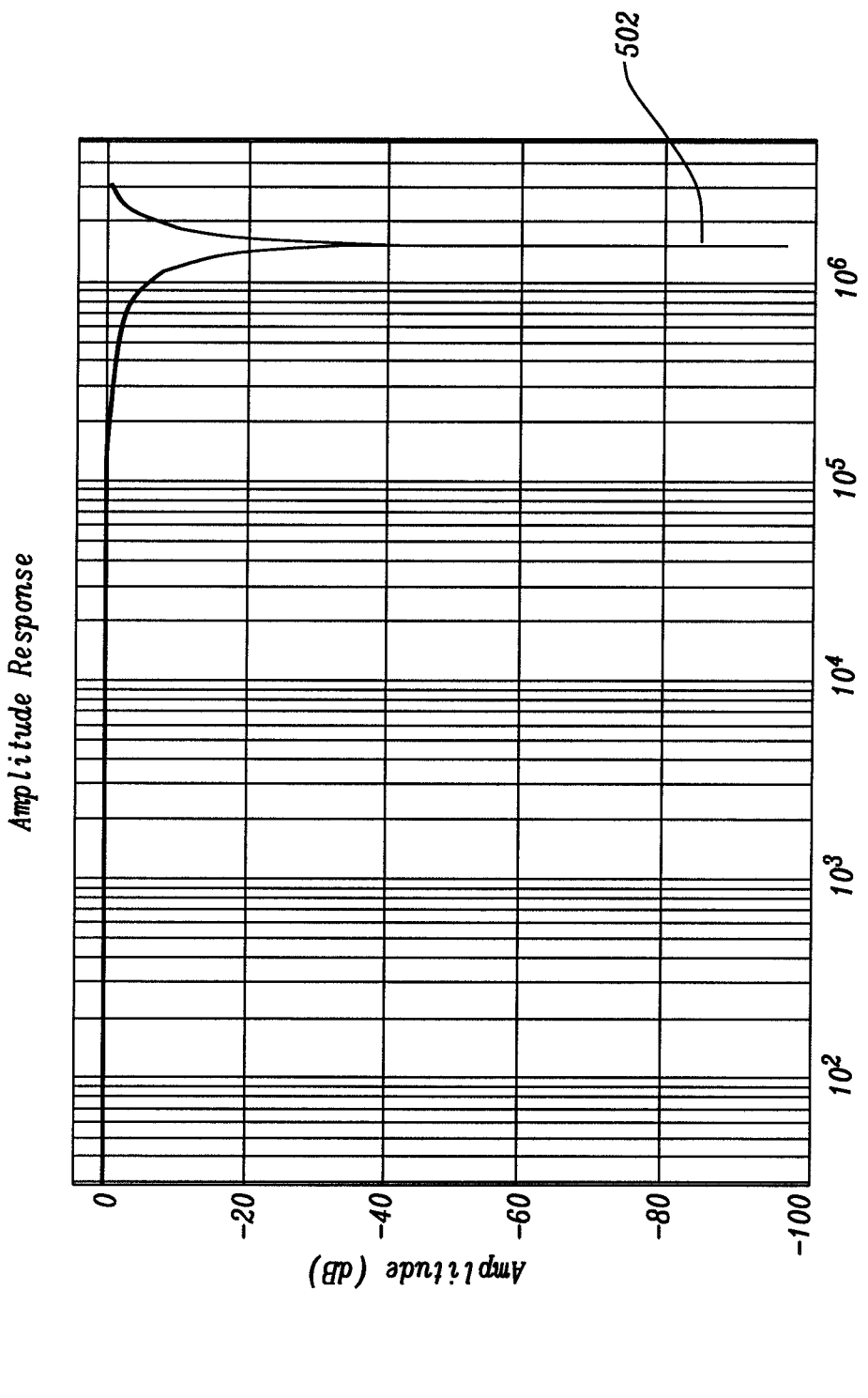
FIG. 5 is a graph illustrating the frequency response of the length 2 moving average filter 204 for the specific embodiment of FIG. 3 when operating on a 2-level SDM input signal sampled at 6.144 MHz.

FIG. 5 is a graph illustrating the frequency response of the length 2 moving average filter 204 for the specific embodiment of FIG. 3 when operating on a 2-level SDM input signal sampled at 6.144 MHz. Visible on the graph is a zero 502 at a quarter of the sampling frequency. There is no droop effect in the audio band (0-24 KHz) and the frequency range containing SDM modulation noise has a zero 502, reducing the energy in that band. The moving average filter zero could fall in the audio region, but because we are oversampling, the cutoff frequency is beyond the audio. The sigma-delta modulator introduces noise in a high frequency band and since here we have a zero in that band the amount of noise introduced by the SDM is reduced.

Figure 6:
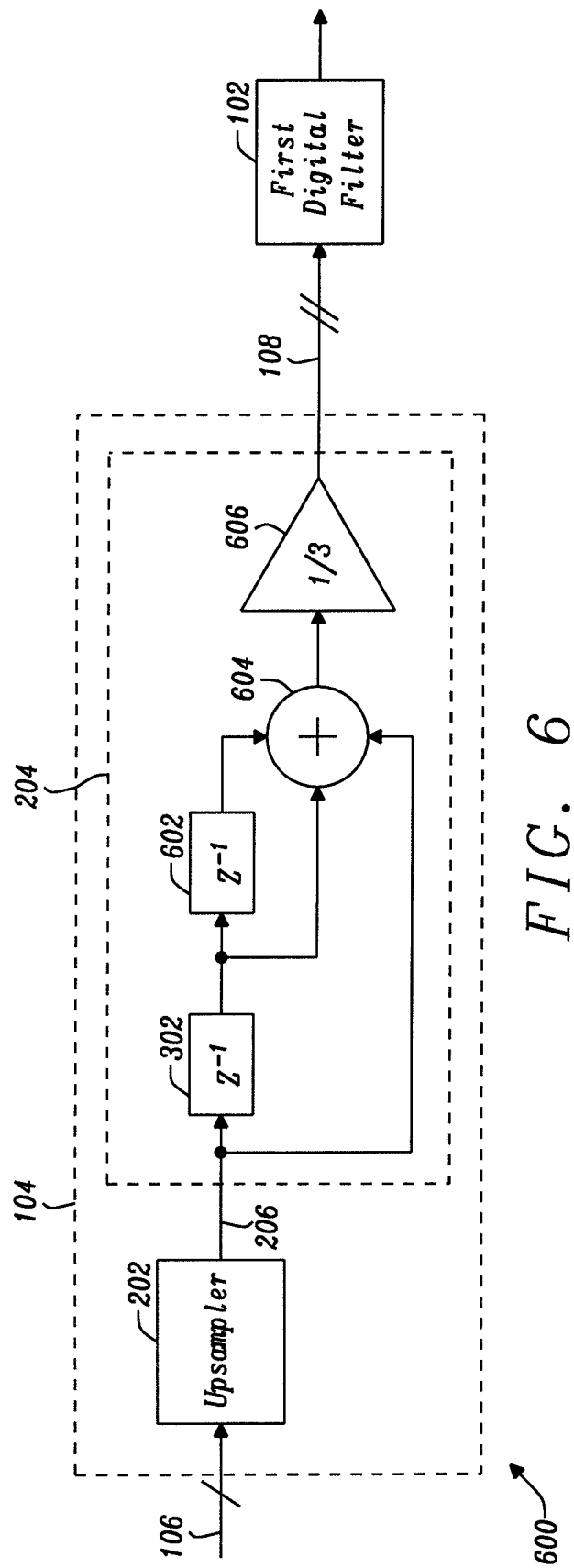
FIG. 6 is a schematic of an embodiment of the signal processing structure as shown in FIG. 2 and in accordance with a third embodiment of the present disclosure wherein the moving average filter is a length 3 moving average filter.

FIG. 6 is a schematic of an embodiment of the signal processing structure as shown in FIG. 2 and in accordance with a third embodiment of the present disclosure wherein the moving average filter 204 is a length 3 moving average filter. Common features between Figures share common reference numerals and variables. In this specific embodiment, the moving average filter 204 comprises a first and a second unit delay element 302, 308, an adder 604 and a divide by three multiplier 606. The first unit delay element 302 has an input coupled to the SDM output signal 206 of the upsampler, a first output coupled to the second unit delay element 602 and a second output coupled to the adder 604. The second unit delay element 602 has an input coupled to the first output of the first unit delay element 302, and an output coupled to the adder 604. The adder 604 has a first input coupled to the output of the unit delay element 302, a second input coupled to the SDM signal 206 and an output coupled to the divide by three amplifier 606. The divide by three amplifier 606 has an input coupled to the output of the adder 604 and an output for providing the SDM output signal 108. It will be appreciated that in a variant of this embodiment the pre-processing digital filter 104 might not include the upsampler 202.

The workings of the moving average filter 204 as implemented in the structure 600 of FIG. 6 is illustrated in FIG. 7. Table 700 shows an example for a 2-level SDM input signal 106. The 2 levels of the SDM input signal 106 are represented by −1 and 1, but it will be appreciated that any 1-bit representation could be used instead. The table 700 is analogous to the table 400 of FIG. 4. The data in the column 702, 704 and 706 illustrate all the possible combinations in input to the adder 604 and the data in the column 708 and 710 are the corresponding output of the adder 604 and of the divide by two multiplier 606. The column 704 corresponds to the first input of the adder 604, which is coupled to the output of the first unit delay element 302. The column 706 corresponds to the second input of the adder 604, which is coupled to output of the second unit delay element 602. The column 702 corresponds to the third input of the adder 604, which is coupled to the input SDM signal 206. The column 708 corresponds to the output of adder 604. The column 710 corresponds to the output of the divide by three multiplier 606 which is also the SDM output of the pre-processing filter 104.

Table 700 shows that in a specific embodiment where the moving average filter 204 is a length 3 moving average filter, a 2-level, 1-bit SDM input signal is converted into a 4-level, 2-bit SDM output signal. As the length of the moving average filter 204 is increased, the quantization levels of the output SDM signal 108 must be considered carefully, as they are not necessarily evenly spaced.

In some embodiments wherein the pre-processing digital filter 104 comprises a moving average filter, the pre-processing digital filter 104 might be configured to force the SDM output signal to a set value until all the unit delay elements in the moving average filter have been filled with a valid state. This is necessary to ensure a correct functioning of the pre-processing filter 104.

Figure 8:
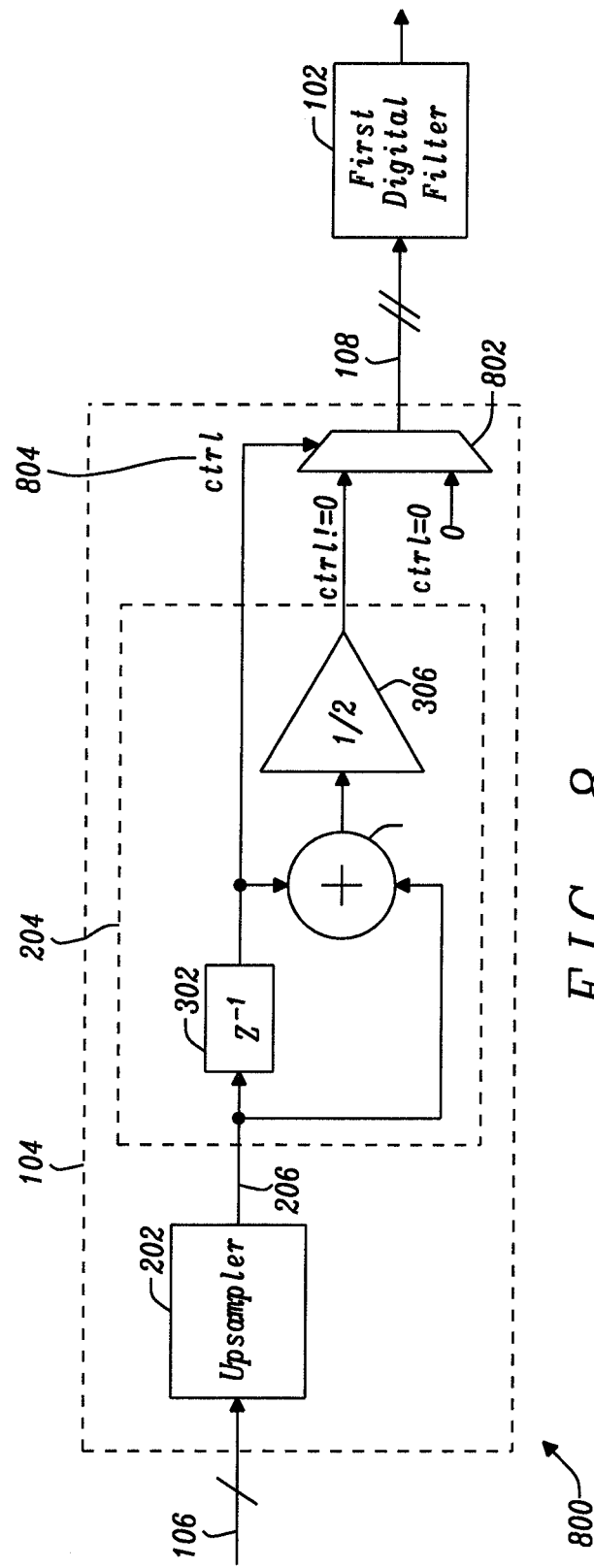
FIG. 8 is a schematic of an embodiment of the signal processing structure as shown in FIG. 3 and in accordance with a fourth embodiment of the present disclosure.

FIG. 8 is a schematic of an embodiment of the signal processing structure as shown in FIG. 3 and in accordance with a fourth embodiment of the present disclosure. Common features between Figures share common reference numerals and variables. In addition to the upsampler 202 and to the moving average filter 204, the pre-processing digital filter 104 of this specific embodiment comprises a 2 to 1 reset multiplexer 802. The multiplexer has a first input coupled to the output of the adder 304, a second input coupled to 0, a control input 804 coupled to the output of the unit delay element 302 and an output to provide the SDM output signal 108. The multiplexer 802 is configured to provide in output the input coupled to zero until the control input is zero and to provide in output the input coupled to the adder 304 when the control input is different from zero.

It will be appreciated that the same could apply for moving average filters of higher length, wherein the control input would be coupled to the output of the unit delay element that is filled last.

The signal processing structure as implemented in the embodiment of FIG. 8 ensures that the moving average filter 204 exhibit a coherent behavior. If for example a reset value were forced in the unit delay elements rather than directly forcing the output to zero, the output could exhibit unexpected behaviors, as illustrated in the tables of FIGS. 9A, 9B and 9C.

The table 900a, 900b and 900c illustrate the workings of the moving average filter 204 of FIG. 3 for a 2-level SDM input signal 206 wherein a reset value has been forced in the unit delay element 302. In this specific example, the 2 levels of the SDM input signal 206 are represented by −1 and 1, but it will be appreciated that any 1-bit representation could be used instead.

The table 900a illustrates the case wherein the unit delay element is forced to 0. The table 900b and 900c illustrate the case wherein the unit delay element 302 is forced to either one of the possible input levels 1 (table 900b) and −1 (table 900c).

The data in the columns 902 and 904 illustrate all the possible combinations in input to the adder 304 and the data in the columns 906 and 908 are the corresponding output of the adder 304 and of the divide by two multiplier 306. In particular, the columns 904 correspond to the first input of the adder 304, which is coupled to the output of the unit delay element 302, hence equal to the reset state. The columns 902 corresponds to the second input of the adder 304, which is coupled to the input SDM signal 206. The column 906 corresponds to the output of adder 304. The column 908 corresponds to the output of the divide by two multiplier 306 which is also the SDM output of the pre-processing filter 104.

Table 900a shows that if a reset value of 0 is input into the delay element 302, the SDM output signal will be 0 when the SDM input signal is 1 and −1 when the SDM input signal is −1, whereas the SDM output signal should be 0 in both cases.

Table 900b and 900c shows that if the unit delay element 302 is filled with either one of the input levels, the SDM output signal remains inconsistent because the output value changes based on the sign of the input. Hence, for a consistent first output sample, an embodiment which forces the output of the block to zero until the delayed input has been filled with a valid state is preferred, as previously explained.

It will be appreciated that the structure of FIG. 8 can be modified to work for inputs of any level and a moving average filter of any length. The Ctrl line could be coupled to the delay element that is filled last in the chain.

In some embodiments wherein the pre-processing digital filter 104 comprises an upsampler and the upsampler is placed before the moving average filter, the upsampler might comprise some control logic.

Figure 10:
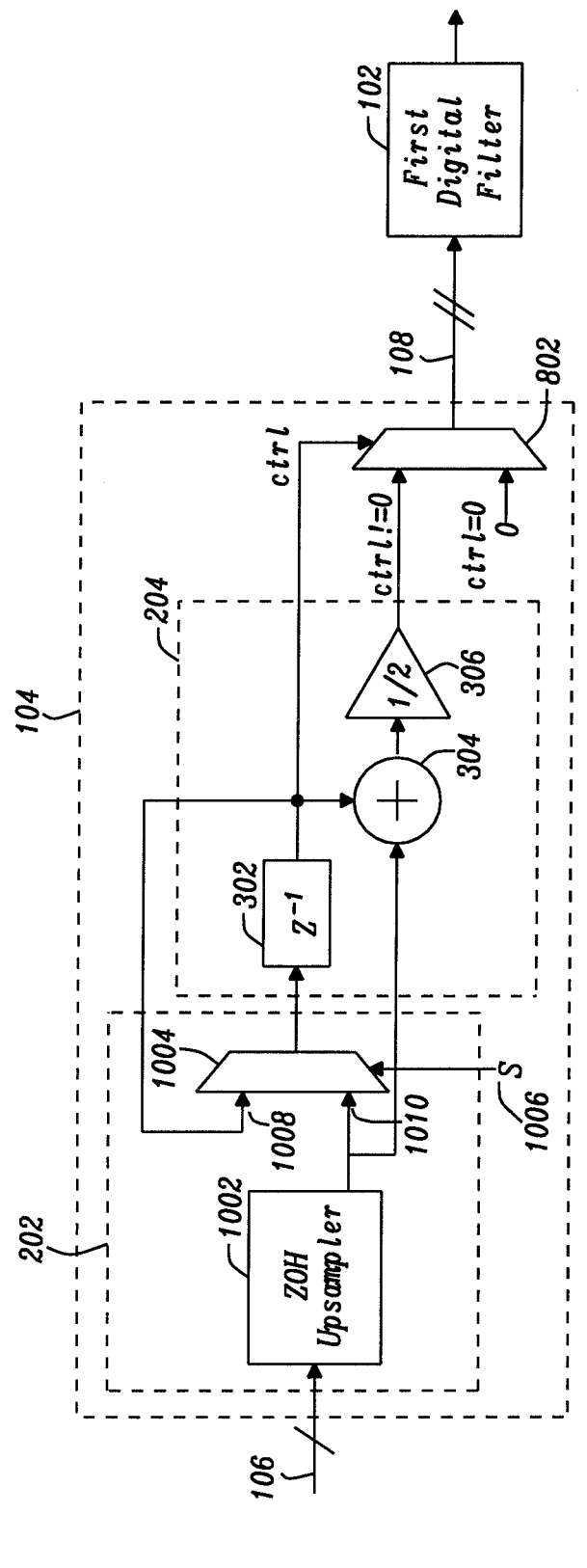
FIG. 10 is a schematic of an embodiment of the signal processing structure as shown in FIG. 8 and in accordance with a fifth embodiment of the present disclosure.

FIG. 10 is a schematic of an embodiment of the signal processing structure as shown in FIG. 8 and in accordance with a fifth embodiment of the present disclosure. Common features between Figures share common reference numerals and variables.

In this specific embodiment the upsampler 202 comprises a zero-order hold upsampler and a control multiplexer 1004. The control multiplexer 1004 has a control input for receiving a control signal 1006, a first multiplexer input 1010 coupled to the output of the ZOH upsampler 1002, a second multiplexer input 1008 coupled to an input of the adder 304 and a multiplexer output coupled to the unit delay element 302. The control signal 1006 is given by a signal S[n] such that at clock cycle zero S[0]=0 and at the following clock cycles S[n+1]=~S[n]. The control multiplexer 1004 is configured to select one between the first and the second multiplexer input based on the control signal 1006.

In some embodiments, the first digital filter 102 comprises a sigma-delta modulator configured to provide a SDM signal at the output of the first digital filter 102. For example, the first digital filter 102 might comprise a quasi-orthonormal or a biquad filter. A quasi-orthonormal filter is quasi-orthonormal structure as described in Adaptive Recursive State-Space Filters Using a Gradient-Based Algorithm by Johns et al, IEEE Transactions on Circuits and Systems, Vol. 37, No. 6, June 1990, herein incorporated by reference.

Figure 11:
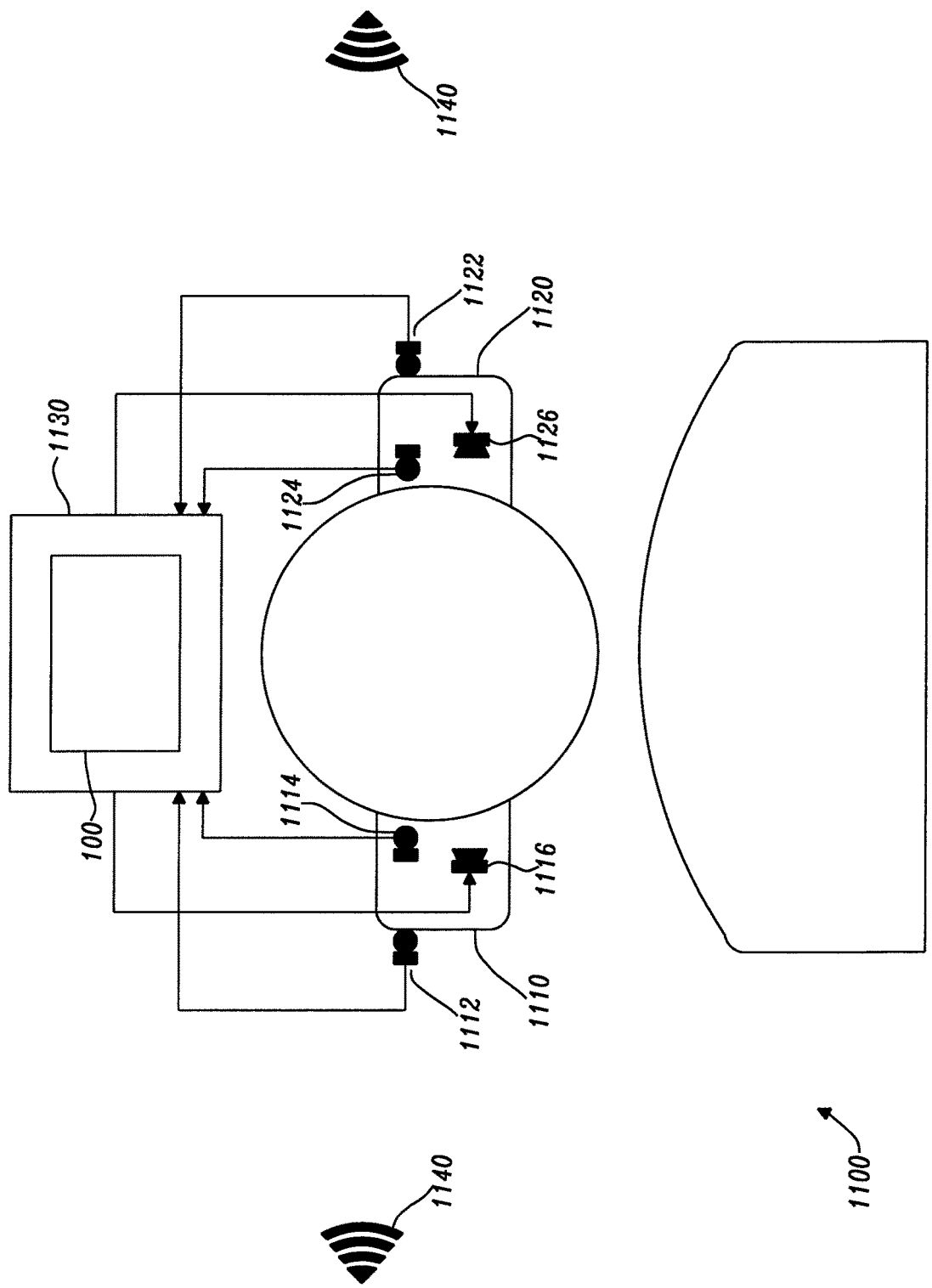
FIG. 11 is a schematic of a headphone apparatus which may be provided according to the present disclosure.

The disclosure is not limited to any particular device, but as an example, FIG. 11 is a schematic of a headphone apparatus which may be provided according to the present disclosure.

The apparatus 1100 comprises a left headphone cup 1110, a right headphone cup 1120 and a processing unit 1130. The apparatus 1100 further comprises: a left feedforward microphone 1112 placed externally to the left headphone cup 1110, a left feedback microphone 1114 and a left speaker 1116 placed internally to the left headphone cup 1110, a right feedforward microphone 1122 placed externally to the right headphone cup 1120, a right feedback microphone 1124 and a right speaker 1126 placed internally to the right headphone cup 1120. The processing unit 1130 comprises a signal processing structure 100 according to the disclosure, and optionally comprises other processing circuitry.

The microphones, the speakers and the processing unit 1130 implement a so-called active noise cancellation system (ANC). Active noise cancellation systems aim to reduce the environmental noise 1140 experienced by users of the headphone apparatus 1100 by superimposing an anti-noise signal generated by the processing unit 1130 to the audio signal that is being reproduced by the headphone apparatus 1100.

In operation, the feedforward microphones 1112 and 1122 detect the environmental noise signal 1140. The output of the microphones 1112 and 1122 is sent to the processing unit 1130 to be inverted and generate a feedforward anti-noise signal. The feedback microphones 1114 and 1124 detect the audio signal inside the headphone cups, at the user's ears. The output of the microphones 1114 and 1124 is sent to the processing unit 1130 and compared to the original audio signal and the difference used to create a feedback anti-noise signal. The anti-noise signal is a combination of the feedback and feedforward anti-noise signals and is mixed to the original audio signal to achieve noise cancellation.

Complex signal processing of the anti-noise signals is generally necessary in order to achieve optimal noise suppression at the user's ears, since the noise signal perceived at the user's ear, the noise signal detected by the feedforward microphones and the noise signal detected by the feedback microphones all travel along different acoustic paths. For example, the ANC might have to account for attenuation and phase shift experienced by the environmental noise signal when travelling through the headphone cups and/or for noise introduced in the anti-noise signal by the electrical components of the processing unit itself, such as quantization noise.

In some embodiments, the microphone 1112, 1114, 1122 and 1124 are digital microphones and their output signal is pulse density modulated.

In standard digital systems operating with digital microphones, filtering of the microphones' output signal requires to first convert the signal into pulse code modulation (PCM), then filter and finally convert back to pulse density modulation (PDM). However, this approach generally increases the latency of the system because decimation and interpolation must be performed in order to pass from PDM to PCM.

By using filters that operate directly on the oversampled PDM output of the digital microphones it is possible to reduce the latency of the system and minimize the hardware area, since there is no longer need of large decimator and interpolator blocks.

It will be appreciated that even though in the drawing the processing unit 1130 is displayed as a single block outside the headphone cups, in different embodiments the processing unit may consist of one or more physical blocks that may or may not be embedded in the headphone cups.

Various improvements and modifications may be made to the above without departing from the scope of the disclosure. In particular, it is to be appreciated that the disclosure is not limited to inputs of any particular level or to low pass filters of any particular length.

What is claimed is:

1. A signal processing structure comprising:
   a first digital filter configured to operate on received sigma-delta modulated input signals; and
   a second pre-processing digital filter configured to:
     receive a sigma-delta modulated input signal, directly low pass filter the sigma-delta modulated input signal and provide an output sigma-delta modulated signal;
   wherein said output sigma-delta modulated signal is provided as an input for said first digital filter.

2. The signal processing structure of claim 1, wherein the second pre-processing digital filter comprises a moving average filter for said low pass filtering of the sigma-delta modulated input signal.

3. The signal processing structure of claim 1, wherein the pre-processing digital filter comprises an upsampler configured such that a sampling rate of the output sigma-delta modulated signal is greater than a sampling rate of the input sigma-delta modulated signal.

4. The signal processing structure of claim 3, wherein the upsampler comprises a zero order hold upsampler.

5. The signal processing structure of claim 3, wherein the upsampler is placed before the moving average filter.

6. The signal processing structure of claim 2, wherein the moving average filter comprises a series of N unit delay elements, an adder and a divide by M amplifier, wherein N is an integer and M is equal to N+1;

the series of unit delay element is configured to receive in input the SDM input signal and each unit delay element is configured to provide an output to the adder;

the adder is configured to provide a sum of the SDM input signal and the output of each unit delay element in the plurality of unit delay elements;

the divide by M amplifier is configured to divide the sum provided by the adder and to provide the output SDM signal.

7. The signal processing structure of claim 6, wherein the output signal of the second pre-processing digital filter is configured to force the output sigma-delta modulated signal to a set value until each of the N unit delay elements of the moving average filter has been filled with a valid state.

8. The signal processing structure of claim 1, wherein the first digital filter comprises a sigma-delta modulator.

9. The signal processing structure of claim 8, wherein the first digital filter comprises a quasi-orthornormal or a biquad filter.

10. An audio signal processing structure, comprising:

a first digital filter configured to operate on received sigma-delta modulated input audio signals; and a second pre-processing digital filter configured to: receive a sigma-delta modulated input audio signal, directly low pass filter the sigma-delta modulated input audio signal and provide an output sigma-delta modulated audio signal;

wherein said output sigma-delta modulated audio signal is provided as an input for said first digital filter.

11. Headphones comprising an audio signal processing structure, wherein the audio signal processing structure comprises a first digital filter configured to operate on received sigma-delta modulated input audio signals; and a second pre-processing digital filter configured to: receive a sigma-delta modulated input audio signal, directly low pass filter the sigma-delta modulated input audio signal and provide an output sigma-delta modulated audio signal;

wherein said output sigma-delta modulated audio signal is provided as an input for said first digital filter.

12. The headphones of claim 11, wherein the audio signal processing structure is provided as part of an adaptive noise cancellation device.

13. A method of signal processing comprising:

providing a first digital filter to operate on received sigma-delta modulated input signals; and providing a second pre-processing digital filter to: receive a sigma-delta modulated input signal, directly low pass filter the sigma-delta modulated input signal and provide an output sigma-delta modulated signal;

wherein said output sigma-delta modulated signal is provided as an input for said first digital filter.

* * * * *